March 17, 1964 M. A. MELEHY 3,124,936

THERMOELECTRIC P-N JUNCTION DEVICES

Filed Nov. 13, 1961

INVENTOR.
MAHMOUD A. MELEHY
BY
Barlow & Barlow
ATTORNEYS

United States Patent Office 3,124,936

Patented Mar. 17, 1964

3,124,936
THERMOELECTRIC P-N JUNCTION DEVICES

Mahmoud A. Meleby, Scotland, Conn.

Filed Nov. 13, 1961, Ser. No. 152,964
7 Claims. (Cl. 62—3)

This invention relates to thermoelectric devices and more particularly to single-crystal semiconductor materials as thermoelectric elements.

Thermoelectric devices having non-single crystal junctions such as metal-to-metal, or metal-to-semiconductor, or semiconductor-to-semiconductor junctions are well-known. Such thermoelectric junctions are described in numerous references such as the book entitled "Semiconductor Thermoelements and Thermoelectric Cooling," by A. F. Ioffe, published by Infosearch Limited, London, 1957; or the book entitled "Thermoelectricity," by Paul H. Egli, published by John Wiley and Sons, Inc., New York, 1960.

It is well known that a single-crystal semiconductor material may have zones of alternately opposite conductivity types. The boundary between each two neighboring zones of opposite conductivity types is known as a p-n junction. The rectifying, amplifying and switching properties of p-n junction devices are well known. These phenomena are described in many references such as in an article entitled "The Theory of P-n Junctions in Semiconductors and P-n Junction Transistors," by William Shockley, appearing at page 335 of the Bell System Technical Journal for July, 1949, volume 28, No. 3, and in an article entitled "P-N-P-N Transistor Switches," by J. L. Moll, M. Tanenbaum, J. M. Goldey and N. Holonyak, Jr., appearing at page 1174 of the Proceedings of the Institute of Radio Engineers for September, 1956, volume 44, No. 9.

In accordance with my invention, however, I provide two thermoelectric devices each of which consists of a single semiconductor crystal of three or four zones of alternately opposite conductivity types; and appropriate circuits or circuit for each.

A better understanding of my invention may be had upon a reading of the following detailed description and an inspection of the drawings, in which.

Before discussing the problem of heating or cooling in a p-n junction, let us consider first passive and active elements from the standpoint of energy conversion. It is well known that the flow of a D.C. current in an element can be either in the direction of the voltage drop, or the voltage rise across the element. In the first case, the element is called passive. Linear and non-linear resistors are passive elements. If a D.C. current passes through a passive element, all the electrical energy delivered to the element is converted into heat energy if the temperature does not get too high. The rate at which heat energy is generated by the element is simply the product of the current and the voltage drop in the direction of that current. On the other hand, if the passage of a D.C. current through an element is associated with a voltage rise across the element in the direction of that current, the element is said to be active. A battery or a D.C. generator are examples of active elements. An active element furnishes electrical energy rather than dissipates it. Continuous supplying of electrical energy by an active element must be associated with the conversion of some other form of energy to electrical energy. For example, a battery converts chemical energy into electrical energy; and a D.C. generator converts mechanical energy into electrical energy.

Figure 1:
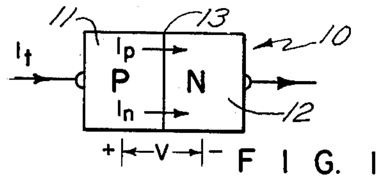
FIG. 1 is a schematic illustration of a p-n junction having a forward D.C. biasing voltage and forward injection of minority carriers.
Figure 2:
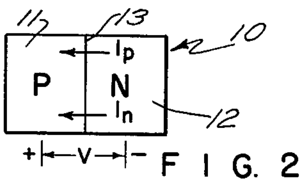
FIG. 2 is another schematic illustration showing an incomplete forward biased p-n junction with backward injection of minority carriers.

To understand the basis of heating and cooling in a p-n junction, let us refer to simple junctions as illustrated in FIGS. 1 and 2. In FIG. 1, there is shown a semiconductor body 10 having a p-region 11 at its left-hand end and an n-type region 12 at its right-hand end, these two regions being separated by a barrier junction 13. Let us first consider, therefore, a forward biased p-n junction as shown in FIG. 1. As is well known, when a p-n junction is forward biased, its external behavior is determined by the two types of minority carrier currents injected at the transition region or barrier 13, and the sum of these two types of currents injected at the barrier is equal to the external current; i.e. $I_t=I_p+I_n$. This general phenomenon is described in an article entitled "The Theory of P-N Junctions in Semiconductors and P-N Junction Transistors," by William Shockley, appearing at page 335 of the Bell System Technical Journal for July, 1949, volume 28, No. 3. In this simple p-n junction, forward biasing is associated with the injection of minority carriers at the transition region, and this injection causes the density of minority carriers to rise on both sides of the transition above their respective thermal equilibrium values according to the formula $$p/p_n=n/n_p=\exp(qv/kT)$$

where $p$ and $n$ are the densities of minority holes and electrons respectively on either side of the transition region of the p-n junction; $p_n$ and $n_p$ are the thermal equilibrium values of $p$ and $n$ respectively; $v$ is the forward junction voltage; $k$ is Boltzmann's constant; $q$ is the magnitude of the electron charge and T is the absolute junction temperature. Accordingly, as seen in FIG. 1, the injected holes cross the boundary 13 from the p-type to the n-type region, and the electrons also cross the boundary 13 from the n-type to the p-type region, constituting an electron current in the same direction as that of the hole current. Both currents are in the same direction as the voltage drop across the junction as may be observed in the schematic drawing. Thus in the transition region or barrier there is a dissipation of electrical power equal to the product of the total injected minority carrier current times the forward junction voltage $v$. This power is converted into heat, and the junction must act as a heat source and may be called passive.

Under certain conditions, a p-n junction may be forward biased and yet the total injected current at the junction may be in the direction of the voltage rise across the junction. Referring now to FIG. 2, it will be seen that there is diagrammed at barrier 13 both hole and electron currents flowing from the n-type to the p-type region. In such a case, it can be said that both types of minority carriers are backwardly injected at the junction. However, if it happens, as will be shown later, that the p-n junction has one type of carriers injected forwardly and the other backwardly, then the direction of the net algebraic sum of both currents will determine whether the injection is forward or backward. For example, if $I_p$ is backwardly injected and $I_n$ is forwardly injected, and $I_p>I_n$, then the total injected current will actually be backwardly injected. On the other hand, if $I_p < I_n$, then the net current is forwardly injected at the junction. In the case of junction 13 of FIG. 2, each of the two types of minority carrier currents and their sum are injected backwardly; i.e. in the direction of the voltage rise across the junction, then, as explained earlier, junction 13 is an active junction, which actually is furnishing electrical power. This power is simply equal to the product of the total current injected at junction 13 and the junction voltage (which is a rise in the direction of the total current injected at barrier 13). Since there are no mechanical or chemical changes in junction 13, it follows from the conservation of energy principle that the junction temperature must drop allowing heat energy to flow to the junction from its neighborhood. Thus junction 13 will act as a heat sink and the thermal energy will be converted there into electrical energy. The rate at which heat energy is converted into electrical energy is simply equal to the product of the net backwardly injected current at junction 13 and the forward junction voltage.

Figure 3:
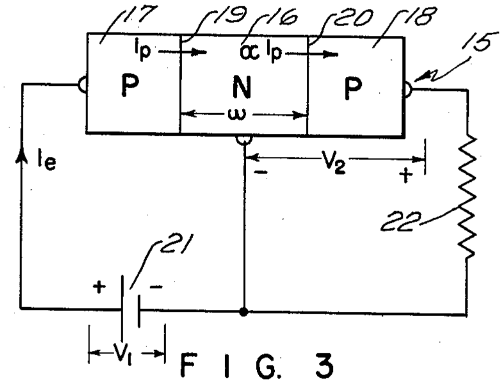
FIG. 3 is a schematic illustration of a two-junction p-n-p thermoelectric device.

I shall describe next two complete devices each of which has one active junction of the sort just discussed. Referring now to FIG. 3, there is shown a semiconductor body 15 including a central n-type region 16 and p-type regions 17 and 18 at the left- and right-hand ends thereof. The p-type region 17 is separated from the n-type region 16 by a barrier junction 19 and the p-type region 18 is separated from the n-type region 16 by a barrier junction 20. Ohmic connections are made to each of the p-type and n-type regions, and the positive pole of a battery or D.C. source 21 is connected to the p-type region 17, the negative pole of battery 21 being connected to the n-type region 16 and to one end of the resistance 22, while the other end of the resistance 22 is connected to the p-type region 18. For reasons which will be presently more fully discussed, the conductivity of the p-type region 17 must be much higher than that of the n-type region 16, and the conductivity of the p-type region 18 must similarly be much higher than that of the n-type region 16. Additionally, the width $w$ of the n-type region 16 must be much less than the diffusion length for minority carriers in that zone. In order to have a useful and practical device with the width of the n-type zone 16 as large as possible, materials must be chosen or developed for which the diffusion length is as large as possible. It will further be noted in FIG. 3 that junction 19 is connected to the circuit in a fashion whereby the junction is forward biased and an appropriate resistance 22 is connected between the regions 16 and 18 which controls the power furnished by junction 20, whose generated electrical power is substantially equal to the power dissipated in resistance 22. In operation, the hole current at junction 19 is almost the only current injected if the conductivity of zone 17 is much higher than that of 16. Accordingly, if $I_p$ is the hole current and $I_e$ is the input current, then $I_e \cong I_p$. If the width $w$ of the n-type zone 16 is much less than the diffusion length $L_p$ for minority holes in the zone 16, then a large portion $\alpha I_p$ of the hole current $I_p$ injected at junction 19 will arrive at junction 20; where $\alpha$ is a fraction very nearly equal to unity. Furthermore, the density of minority holes just on the left of junction 20 as viewed in the drawing will be much higher than its thermal equilibrium value. Thus, junction 20 will be forward biased with a voltage $v2$ whose polarity is as indicated in FIG. 3. Since the direction of the whole current $\alpha I_p$ is along the voltage rise across junction 20, then $\alpha I_p$ is a backwardly injected current in a forward biased junction, and as explained above, this junction 20 must accordingly cool off. Because junction 20 is forward biased, there will be an injection of minority electrons into region 18 from left to right as viewed in the drawing, and it follows that the electron current will have the direction from right to left as viewed in the drawing, which is in the direction of the voltage drop across junction 20. Therefore, the electron current will be a forwardly injected current. Such type of injection, as discussed earlier, tends to decrease the cooling effect caused by the hole current backwardly injected at junction 20. Therefore, for best cooling at junction 20, the electron current injected at junction 20 must be reduced as much as possible. This can be simply done by making the conductivity of zone 18 much higher than that of zone 16.

Figure 4:
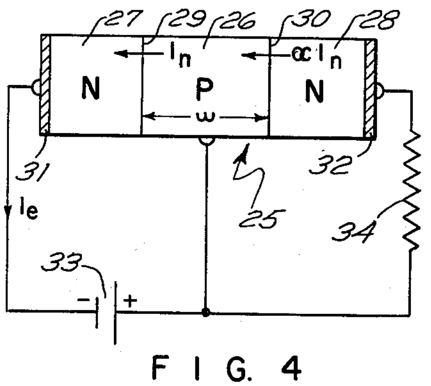
FIG. 4 is a similar schematic illustration of an n-p-n thermoelectric device with a modified heat conductor device.

In FIG. 4, I have shown another semiconductor body 25 having a central p-type region 26 and two n-regions 27 and 28. Region 27 is separated from region 26 by a barrier junction 29, while region 28 is separated from region 26 by barrier junction 30. Suitably affixed to the outer ends of the n-type regions 27 and 28 are metallic disks 31 and 32 which are affixed ohmically to these regions by welding or other suitable means, and to these metallic disks ohmic connections are made, the negative pole of a battery 33 being connected to plate 31 while the positive pole of battery 33 is connected to the p-type region 26 as well as to one end of a resistance 34, the other end of which is connected to a metallic disk 32 that is affixed ohmically to region 28. This particular semiconductor device is identical in operation to that just described in connection with FIG. 3. The only difference that exists here is that the type of regions has been changed, and accordingly the battery voltage has been reversed to make junction 29 forward biased. Additionally, the metallic disks which are physically attached to regions 27 and 28 serve as heat conductors as well as electrical conductors, and can also be used for the device of FIG. 3.

Figure 5:
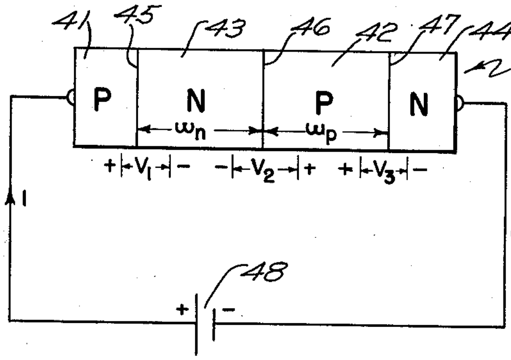
FIG. 5 is a schematic illustration of a three-junction thermoelectric device.

Referring now to FIG. 5, there is shown therein a three-junction thermoelectric device having a semiconductor body generally indicated 40 and having a pair of p-type regions 41 and 42 and a pair of n-type regions 43 and 44 in a p-n-p-n type of arrangement. Between regions 41 and 43 is a barrier junction 45, and between regions 42 and 43 is a barrier junction 46, while between the regions 42 and 44 there is a barrier region 47. Ohmic connections are made to regions 41 and 44 by suitable wires to a battery 48. The operation of this device is similar in some respects to that previously discussed, and here the conductivity of region 41 is much higher than that of region 43. Similarly the conductivity of region 44 is much higher than that of region 42. Also the width of region 43 $w_n$ is much less than the diffusion length $L_p$ for minority holes in zone 43, and the width $w_p$ of zone 42 is much less than the diffusion length $L_n$ for minority electrons in zone 42. With a D.C. source consisting of a battery 48 connected to the device as shown, then both junctions 45 and 47 will be forward biased. It accordingly follows that almost only holes will be injected inwardly at junction 45 and only electrons will be injected inwardly at junction 47. Thus, just to the right of junction 45 the density of minority holes rises far above its thermal equilibrium value, and this situation will be maintained throughout zone 43 since $w_n$ is much less than the diffusion length for minority carriers in zone 43. Similarly, the density of minority electrons will be far above their thermal equilibrium value just to the left of junction 47, and this situation will be maintained throughout zone 42. Thus, junction 46 must also be forward biased. Since at junction 46 the hole current as well as the electron current is along the direction from zone 43 to 42, i.e. along the voltage rise across the junction, each of the two currents is injected backwardly in a forward biased p-n junction. Hence, junction 46 is an active junction and will act as a heat sink. It will also be noticed that the other two forward biased junctions 45 and 47 act as heat sources, since both junctions are forward biased and minority carriers are injected forwardly at each junction. If the impurity concentration in zones 42 and 43 are uniform, and if the three junction temperatures are the same, it can be shown that under optimum design conditions the rate at which heat energy is pumped from junction 46 to junctions 45 and 47 is less but very nearly equal to the power furnished by battery 48, as may be seen from the following formula:

$$\eta=(1-\delta)100$$

where $$\delta=2(w_n w_p/L_n L_p[1/\ln(I/I_s)]$$

and $\eta$: the percentage of the rate of heat energy pumped out of junction 46 to the power furnished by the battery;
I: the battery current;
$I_s$: the reverse saturation current of junction 46 if the diffusion lengths for minority holes in zone 43 and minority electrons in zone 42 were $w_n$ and $w_p$, respectively;
$L_n$: the diffusion length for minority electrons in zone 42;
$L_p$: the diffusion length for minority holes in zone 43;
$w_n$: the width of the n-type zone 43;
$w_p$: the width of the p-type zone 42.

It is apparent that $\eta$ can be made as close to 100% as possible by reducing $(w_n/L_p)$ and $(w_p/L_n)$ simultaneously, and by selecting the proper materials.

Figure 6:
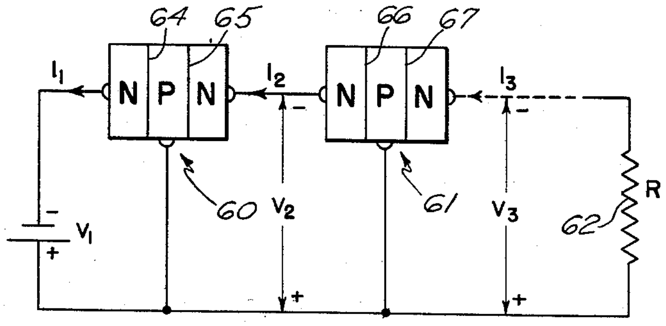
FIG. 6 is a schematic illustration of several identical n-p-n thermoelectric devices connected in cascade.

Referring now to FIG. 6, I have shown a circuit for cascading two or more two-junction thermoelectric devices of the n-p-n type. p-n-p devices can be connected identically with the battery polarity reversed. For simplicity, the figure shows only two devices 60 and 61. This circuit possesses some useful properties. With the specification described above that the (middle) p-region in each device is much shorter than the diffusion length for minority electrons, it is well known from the transistor theory that the following relation exists $$I_1 \cong I_2 \cong I_3$$

Also for certain values the load resistance R, $v_1$, $v_2$ and $v_3$ will be described by $$v_3/v_2 \cong v_2/v_1 \cong C$$

where C is a constant less than, but nearly equal to, unity.

Consider now the power generated or dissipated at every junction:

Electrical power dissipated at junction $64=v_1I_1$ (a passive junction)
Electrical power dissipated at junction $66=v_2I_2 \cong v(I_1C$ a passive junction)
Electrical power generated at junction $65=v_2I_2 \cong v_1I_1C$ an active junction)
Electrical power generated at junction $67=v_3I_3 \cong v_1I_1C^2$ (an active junction)

Therefore, by means of the shown circuit, it is possible to use a battery which furnishes a power $(v_1I_1)$ to generate cooling at a rate equal to $v_1I_1(C^2+C) \cong 2v_1I_1$. Simultaneously, heat is generated at the junctions at a rate equal to $v_1I_1(1+C) \cong 2v_1I_1$. Also at the load resistance R heat is generated at the rate of about $v_1I_1C^2$. This means that the rate at which heat is generated at the junctions and the load is equal to $v_1I_1(1+C+C^2) \cong 3v_1I_1$ with a battery only furnishing a power of $(v_1I_1)$. This simple analysis neglects the heat leaking between the hot and cold junctions.

Figure 7:
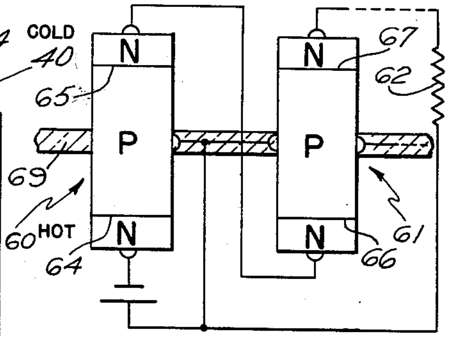
FIG. 7 is a diagrammatic and schematic illustration of a device constructed in accordance with the invention.

FIGURE 7 shows a practical arrangement of the cascaded semiconductors schematically illustrated in FIGURE 6. Here they are physically arranged with the cold junctions on one side of the insulating material 69 and the hot junctions on the other side thereof. Thus heat is "generated" on one side and "absorbed" on the other. In this fashion we therefore have the "Cold" region at the upper half of FIGURE 7 and the "Hot" region at the lower half of said FIGURE 7. A similar arrangement can be made for p-n-p devices.

I claim:

1. A thermoelectric device comprising a semiconductor body of alternate opposite conductivity types with at least one active p-n junction and at least one passive p-n junction forming inner and outer regions, the outer regions having higher conductivity than the inner region, the width of the inner region being much less than the diffusion length for minority carriers in said inner region with distance between the said p-n junctions being sufficiently large so that the heat conduction between the junctions is small.

2. A thermoelectric device as in claim 1 wherein the diffusion length for minority carriers in the inner region is on the order of at least 1500 microns.

3. A thermoelectric device as in claim 1 wherein the central region is made up of N and P type material.

4. A thermoelectric device as in claim 1 wherein the central region is made up of N type material.

5. A thermoelectric device as in claim 1 wherein the central region is made up of P type material.

6. A thermoelectric device comprising a body of semiconductor material with adjacent layers being of opposite conductivity types forming a plurality of p-n junctions, said device including spaced outer layers and at least one interior base layer, a source of D.C. voltage connected between the interior base layer and one outer layer, a load device connected between said other outer layer and said interior base layer, the p-n junctions being forwardly biased so that there is a backward injection of minority carriers at the p-n junction adjacent the said other outer layer connected to said load device.

7. A thermoelectric device comprising a semiconductor device comprising successive layers with adjacent layers being of opposite conductivity types forming at least three p-n junctions, said device including two outer layers of opposite conductivity type and two interior layers of opposite conductivity type, a source of D.C. voltage connected between the outer layers, said p-n junctions being forwardly biased, the width of the interior N and P layers being greater than the diffusion length for minority carriers whereby the p-n junctions between the interior layers forms a heat sink.

References Cited in the file of this patent

Volker: Transactions of the Australian Institute of Refrigeration Incorporated, February 1960, pages 13–18.